US005690737A

United States Patent [19]
Santiago et al.

[11] Patent Number: 5,690,737
[45] Date of Patent: Nov. 25, 1997

[54] PROCESS FOR FORMING EPITAXIAL BAF$_2$ ON GAAS

[75] Inventors: Francisco Santiago, Elkridge; Tak-Kin Chu, Bethesda; Michael Stumborg, Rockville, all of Md.

[73] Assignee: The United States of America as represented by the Secretary of the Navy, Washington, D.C.

[21] Appl. No.: 454,983

[22] Filed: May 31, 1995

Related U.S. Application Data

[63] Continuation-in-part of Ser. No. 246,209, May 19, 1994, Pat. No. 5,435,264.

[51] Int. Cl.$^6$ ................................................. C30B 25/18
[52] U.S. Cl. ........................... 117/92; 117/108; 117/940
[58] Field of Search .......................... 117/92, 108, 940

[56] References Cited

U.S. PATENT DOCUMENTS

| | | | |
|---|---|---|---|
| 5,225,561 | 7/1993 | Kirlin et al. | 546/256 |
| 5,280,012 | 1/1994 | Kirlin et al. | 505/447 |
| 5,435,264 | 7/1995 | Santiago et al. | 117/92 |
| 5,453,494 | 9/1995 | Kirlin et al. | 534/15 |

*Primary Examiner*—Robert Kunemund
*Attorney, Agent, or Firm*—James B. Bechtel, Esq.

[57] ABSTRACT

A process for growing single crystal epitaxial BaF$_2$ layers on gallium arsenide substrates by slowly reacting Ba, BaCl$_2$, BaI$_2$, BaBr$_2$, BaF$_2$·BaCl$_2$, BaF$_2$·BaBr$_2$, BaF$_2$·BaI$_2$, BaCl$_2$·BaBr$_2$, Ba$_3$(GaF$_6$)$_2$, BAH$_2$, or BaO$_2$ vapor with a clean, hot GaAs substrate at 500° C. to 700° C. in high vacuum until a uniform, thin (~12 Å) layer of reaction product is formed and then vapor depositing BaF$_2$ onto the reaction layer at room temperature to 400° C. to form the single crystal, epitaxial BaF$_2$ layer.

32 Claims, No Drawings

PROCESS FOR FORMING EPITAXIAL BAF$_2$ ON GAAS

RELATED APPLICATION

This application is a continuation-in-part of U.S. patent application Ser. No. 08/246,209 filed May 19, 1994, now U.S. Pat. No. 5,435,264.

BACKGROUND OF THE INVENTION

Materials used in semiconductor devices must have good semiconducting properties, good electron mobility, and the ability to host an epitaxial insulating material. Several materials are available which have good semiconducting properties and good electron mobilities but which are unsuitable because a good epitaxial insulator cannot be formed on them. Silicon, however, is widely used in semiconductor devices because silicon dioxide forms naturally on silicon and silicon dioxide is an insulator. The disadvantage of silicon is that its mobility is not as high as in other semiconductors and silicon dioxide is not the strongest insulator available. This means that compromises in speed and performance are made when silicon is used in electronic devices.

Gallium arsenide (GaAs) is also a semiconductor and is used in some electronic applications. A device made out of GaAs would be faster than the same device made out of silicon because GaAs has an electron mobility that is considerably higher than that of silicon. Unfortunately, there is no native insulating oxide suitable for GaAs electronic devices.

Several materials have been used to provide insulating films on III-V compound semiconductor devices. Some of these films were previously used on silicon semiconductor devices. Examples include $SiO_2$, $Si_3N_4$, $Al_2O_3$, and $P_2O_3$ films. New films have also been developed specifically for the III-V compound semiconductors. For instance, A. J. Shuskus (U.S. Pat. No. 4,546,372) developed an essentially oxygen-free, amorphous, phosphorous-nitrogen glass passivating film for III-V compound semiconductors. Similarly, J. Nishizawa et at. (U.S. Pat. No. 4,436,770) disclose new gallium oxynitride and aluminum oxynitride insulating films for III-V compound semiconductors. These materials have found only limited application.

It would be desirable to provide a new method of depositing a new insulator material on gallium arsenide substrates.

SUMMARY OF THE INVENTION

Accordingly an object of this invention is to provide a new process for forming insulator layers on gallium arsenide substrates.

Another object of this invention is to provide a new method of depositing single crystal, epitaxial barium fluoride onto gallium arsenide substrates.

These and other objects of this invention are accomplished by providing a process of A. vapor depositing barium or a barium compound that is barium chloride, barium iodide, barium bromide, barium fluochloride, barium fluobromide, barium fluoiodide, barium chlorobromide, barium fluogallate, barium hydride, or barium peroxide on a clean, hot single crystal gallium arsenide substrate at a temperature of from 500° C. to 700° C., in a vacuum having a background pressure of $10^{-8}$ millibars or less wherein the deposition of the barium compound is slow enough to allow the barium or barium compound vapor to react with the gallium arsenide substrate surface and form a uniform, epitaxial coating of the reaction product of barium and gallium arsenide or the reaction product of the barium compound and gallium arsenide is;

B. heating the barium/gallium arsenide reaction product layer or the barium compound/gallium arsenide reaction product layer at a temperature of from 500° C. to 700° C. in the absence of the barium or barium compound vapor in a vacuum having a background pressure of $10^{-8}$ millibars or less to remove unreacted barium or barium compound; and C. heating the coated substrate at a temperature of from room temperature to 700° C. and depositing barium fluoride onto the coated substrate at a rate of from 1 to 100 Å per minute until the desired thickness of uniform, single crystal, epitaxial barium fluoride has been achieved.

DETAILED DESCRIPTION OF THE PREFERRED EMBODIMENT

This application is a continuation-in-part of copending U.S. patent application Ser. No. 08/246,209 which was filed on May 19, 1994 by Francisco Santiago, Tak-Kin Chu, and Michael F. Stumborg, which is hereby incorporated by reference in its entirety.

In U.S. patent application Ser. No. 08/246,209, a heated gallium arsenide substrate was exposed to barium fluoride vapor in ultrahigh ($10^{-8}$ millibars or less background pressure) vacuum to form a uniform epitaxial layer of one or two monolayers (~12 Å) of barium fluoride/gallium arsenide reaction product. X-ray photoelectron spectroscopy (XPS) analyses show that the uniform, single crystal, epitaxial barium fluoride/gallium arsenide reaction product layer is free of fluorine (fluorides). This indicates that the reaction mechanism involves the breaking of the barium-fluorine bonds which allows the fluorine to escape or be removed and the barium to react with the gallium arsenide surface. Any barium compound in which the barium-anions bonds are broken under the above process reaction conditions would produce the same reaction product as barium fluoride does. Similarly, barium vapor can be used to produce the same reaction product as barium fluoride does.

In the present case, a heated gallium arsenide substrate surface is exposed to either barium vapor or the vapor of a barium compound that is barium chloride ($BaCl_2$), barium iodide ($BaI_2$), barium bromide ($BaBr_2$), barium fluochloride ($BaF_2 \cdot BaCl_2$), barium fluobromide ($BaF_2 \cdot BaBr_2$), barium fluoiodide ($BaF_2 \cdot BaI_2$), barium chlorobromide ($BaCl_2$ or $BaBr_2$), barium fluogallate [$Ba_3(GaF_6)_2$ or $Ba_3(GaF_6)_2 \cdot H_2O$], barium hydride (BAH2), or barium peroxide ($BaO_2$) in ultrahigh ($10^{-8}$ millibars or less background pressure) vacuum to form a uniform epitaxial layer of one or two monolayers (~12 Å) of the barium/gallium arsenide reaction product or the barium compound/gallium arsenide reaction product. When barium is used, the coated substrate is heated in ultrahigh vacuum to remove unreacted barium after the barium/gallium arsenide reaction product layer has been formed. When a barium compound is used, the coated substrate is heated in ultrahigh vacuum to remove unreacted barium compound after the barium compound/gallium arsenide reaction product layer has been formed. Finally, a uniform, single crystal epitaxial layer of barium fluoride is deposited onto the barium/gallium arsenide reaction product layer or onto the barium compound/gallium arsenide reaction product layer at a substrate temperature of from room temperature to 700° C. in ultrahigh vacuum.

The term single crystal gallium arsenide or gallium arsenide crystal substrate includes gallium arsenide single crystal wafers, gallium arsenide epitaxial layers commonly known as epilayers on gallium arsenide single crystal wafers, doped gallium arsenide epilayers on gallium arsenide single crystal wafers, alloys of gallium arsenide (for example, gallium aluminum arsenide, gallium indium arsenide, etc.) on gallium arsenide single crystal wafers, heterostructures of super-lattice made of any combinations of alloys of gallium arsenide on gallium arsenide single crystal wafers, doped or undoped gallium arsenide epilayers on any suitable substrate materials, heterostructures of super-lattice made of combinations of alloys of gallium arsenide on suitable substrate materials.

The present process may be used to grow epitaxial $BaF_2$ directly onto a variety of gallium arsenide substrate surfaces. The gallium arsenide substrate bulk stoichiometry may be balanced, gallium rich, or arsenic rich. The gallium arsenide crystal substrate may be doped or undoped. The gallium arsenide crystal substrate may have any of the conventional orientations including (100), (111), (011) and their equivalents. For example, commercial standard electronic grade polished and etched (100) and (111) oriented crystal wafers will work.

The commercial standard grade gallium arsenide crystal wafers come with a polycrystalline oxide passivation layer that must be removed. The presence of the polycrystalline passivation layer can be detected by analytical techniques like x-ray photoelectron spectroscopy (XPS) and reflective high energy electron diffraction (RHEED). The passivation layer will show oxygen in the XPS spectrum and a RHEED diffraction pattern that shows scattered dots and concentric circles. Removal of the passivation layer leaves the bare gallium arsenide surface whose smoothness is confirmed by the RHEED pattern that shows ordered spots sometimes connected with streaks and the absence of oxygen in the XPS spectrum. Conventional methods for removing the passivation layer may be used. A preferred method is by annealing the gallium arsenide in a vacuum. For example, the gallium arsenide crystal wafers are annealed in a VG Semicon V8OH deposition chamber for one hour at 600° C. in a vacuum of better than $1 \times 10^{-9}$ millibar.

A critical part of this invention is the formation of a thin, uniform, single crystal, epitaxial layer of a reaction product of gallium arsenide with barium or a barium compound that is preferably barium chloride ($BaCl_2$), barium iodide ($BaI_2$), barium biomide ($BaBr_2$), barium fluochloride ($BaF_2 \cdot BaCl_2$), barium fluobromide ($BaF_2 \cdot BaBr_2$), barium fluoiodide ($BaF_2 \cdot BaI_2$), barium chlorobromide ($BaCl2 \cdot BaBr_2$), barium fluogallate [$Ba_3(GaF_6)_2$ or $Ba_3(GaF_6)2 \cdot H_2O$], barium hydride ($BaH_2$), or barium peroxide ($BaO_2$) on the surface of the gallium arsenide substrate. The barium compound is more preferably barium chloride, barium iodide, barium bromide, barium fluochloride, or barium fluobromide, and still more preferably it is barium chloride, barium iodide, or barium bromide. The barium/gallium arsenide reaction product or the barium compound/gallium arsenide reaction product is formed by exposing a clean, hot gallium arsenide single crystal substrate to barium vapor or barium compound vapor, respectively, in ultrahigh vacuum. The temperature of the gallium arsenide substrate and the barium or barium compound vapor flux rate are adjusted to allow the complete formation of a uniform reaction product layer before a substantial amount of barium or barium compound can be deposited on the corresponding barium/gallium arsenide reaction product or barium compound/gallium arsenide reaction product layer. Based on the results with barium fluoride, the thicknesses of the barium/gallium arsenide reaction product layer or the barium compound/gallium arsenide reaction product layer are expected to be self-limiting. Thus, after one or two monolayers (about 12 Å) of the uniform reaction product layer is formed, the barium or barium compound will begin to deposit on the reaction product layer. This will be indicated by a change in reflective high energy electron diffraction (RHEED) pattern from that of gallium arsenide to that of barium or of the barium compound. The deposition rate of barium or of the barium compound is preferably from 1 to 5 Å per minute and more preferably from 2 to 3 Å per minute. If the deposition rate is too fast, a nonuniform epitaxial reaction product layer may be formed which will result in islands and channels being produced when the barium fluoride insulator layer is deposited on the barium/gallium arsenide reaction product layer or the barium compound/gallium arsenide reaction layer. The channels would result in a barium fluoride layer that has electrically conductive paths through it. As a result the barium fluoride layer would be unsuitable as an insulator for electronic devices. For instance, when barium fluoride was used at less than $10^{-10}$ millibars background pressure and a gallium arsenide substrate temperature of 600° C., a barium fluoride deposition rate of about 10 Å per minute produced a uniform barium fluoride/gallium arsenide reaction product layer and an excellent barium fluoride insulator layer was deposited. However, under the same conditions a barium fluoride deposition rate of 25 Å per minute produced three dimensional island growth with electrically conducting channels between the islands.

The gallium arsenide substrate is heated at a temperature of preferably from 500° C. to 700° C., more preferably from 550° C. to 650° C., and still more preferably from 575° C. to 625° C. during the formation of the barium/gallium arsenide reaction product layer or the barium compound/gallium arsenide reaction product layer. The formation of the barium/gallium arsenide reaction product layer or the barium compound/gallium arsenide reaction product layer is done in a vacuum having a background pressure of preferably $10^{-8}$ millibars or less, more preferably $10^{-9}$ millibars or less, and still more preferably $10^{-10}$ millibars or less.

The preferred method of producing either the barium/gallium arsenide reaction product layer or the barium compound/gallium arsenide reaction product layer on the gallium arsenide substrate is analogous to that taught for the production of the barium fluoride/gallium arsenide reaction layer on the gallium arsenide substrate as taught by U.S. application Ser. No. 08/246,209, incorporated by reference above. A standard commercial grade gallium arsenide single crystal wafer is placed in a standard substrate heater in a commercial molecular beam epitaxial (MBE) deposition chamber model Semicon V8OH made by Vacuum Generators. The chamber is evacuated to a background pressure of preferably $10^{-8}$ millibars or less, more preferably $10^{-9}$ millibars or less, and still more preferably $10^{-10}$ millibars or less and is trapped with liquid nitrogen. The gallium arsenide wafer is heated for about an hour under vacuum at a heater temperature of 600° C. to remove the polycrystalline passivation layer from the gallium arsenide surface. Barium or a barium compound taught above is then vapor deposited at a rate of 2.5 Å per minute onto the clean, hot gallium arsenide substrate (600° C. heater temperature). The barium or barium compound deposition is continued until the gallium arsenide reflective high energy electron diffraction (RHEED) pattern gives way to a RHEED pattern for barium or the barium compound.

Once the uniform, single crystal epitaxial barium/gallium arsenide reaction product or barium compound/gallium arsenide reaction product layer has been formed on the single crystal gallium arsenide substrate, the barium vapor or barium compound vapor is removed from the chamber. The uniform, single crystal, epitaxial barium fluoride insulator layer can now be deposited onto the barium/gallium arsenide reaction product layer or the barium compound/gallium arsenide reaction product layer. However, before this is done, it is preferable to heat the reaction product coated gallium arsenide substrate for a short time at a temperature of preferably 500° C. to 700° C., more preferably 550° C. to 650° C., and still more preferably 575° C. to 625° C. in a vacuum having a background pressure of preferably $10^{-10}$ millibars or less, more preferably $10^{-9}$ millibars or less, and still more preferably $10^{-8}$ millibars or less to remove unreacted barium or barium compound. This step should take only a few minutes and progress can be monitored by conventional techniques such as RHEED patterns.

In the final process step, the barium/gallium arsenide reaction product or barium compound/gallium arsenide reaction product coated the gallium arsenide substrate temperature is lowered to a temperature in the range of preferably from room temperature to 700° C., more preferably from room temperature to less than 500° C., still more preferably from room temperature to 400° C., even more preferably from room temperature to 300° C., and most preferably at room temperature. The deposition chamber vacuum is maintained at a background pressure of preferably $10^{-8}$ millibars or less, more preferably $10^{-9}$ millibars or less, and still more preferably $10^{-10}$ millibars or less while the barium fluoride vapor is deposited on the uniform, epitaxial barium/gallium arsenide reaction product layer or the barium compound/gallium arsenide reaction product layer at a rate of preferably 1 to 100 Å per minute, more preferably 1 to 50 Å per minute, and still more preferably from 1 to 5 Å per minute to form a uniform, single crystal, epitaxial barium fluoride layer of the desired thickness.

The process of the present invention may be used in the manufacture of a metal insulator semiconductor field effect transistors (MISFET's), integrated circuit capacitors, and charge couple devices which use insulator layers.

As stated above, the term single crystal gallium arsenide substrate preferably includes doped or undoped gallium arsenide single crystal wafers, doped or undoped gallium arsenide epitaxial layers on gallium arsenide single crystal wafers, doped or undoped epitaxial layers of gallium arsenide alloys (for example, gallium aluminum arsenide, gallium indium arsenide, etc.) on single crystal gallium arsenide wafers, heterostructures of super-lattice made of combinations of gallium arsenide alloys on gallium arsenide single crystal wafers, doped or undoped gallium arsenide single crystal epitaxial layers on suitable substrate materials, doped or undoped epitaxial layers of gallium arsenide alloys on suitable substrate materials, and heterostructures of super-lattice made of combinations of gallium arsenide alloys on suitable substrate materials. More preferably the single crystal gallium arsenide substrate includes doped or undoped gallium arsenide single crystal wafers, doped or undoped gallium arsenide epitaxial layers on gallium arsenide single crystal wafers, and doped or undoped gallium arsenide single crystal epitaxial layers on suitable substrate materials. The gallium arsenide alloys include those that are conventionally used in semiconductor devices. Gallium arsenide alloys that are rich in gallium are preferred. The suitable substrate materials include materials that provide physical support for a thin epitaxial layer of gallium arsenide or gallium arsenide alloys without chemically or electrically interfering with the operation of the epitaxial layer. For example, a thin single crystal epitaxial layer of gallium arsenide on a hybrid semiconductor device or on a chemically inert, electrically insulating circuit board structure. Thus, the single crystal gallium arsenide substrate need not be a wafer but rather can be a thin epitaxial layer requiring support by a non-gallium arsenide material.

Obviously, numerous other modifications and variations of the present invention are possible in light of the foregoing teachings. It is therefore to be understood that within the scope of the appended claims the invention may be practiced otherwise than as specifically described.

What is claimed is:

1. A process for forming a uniform, single, crystal, epitaxial layer of barium fluoride on a single crystal gallium arsenide substrate comprising:

A. vapor depositing barium on a clean, hot single crystal gallium arsenide substrate at a temperature of from 500° C. to 700° C., in a vacuum having a background pressure of $10^{-8}$ millibars or less and wherein the barium deposition is slow enough to allow the barium vapor to react with the gallium arsenide substrate surface and form a uniform, epitaxial coating of barium/gallium arsenide reaction product and continuing until the reaction product layer is completed;

B. heating the barium/gallium arsenide reaction product layer at a temperature of from 500° C. to 700° C. in the absence of barium vapor in a vacuum having a background pressure of $10^{-8}$ millibars or less to remove unreacted barium; and then C. reducing the temperature of the substrate to a temperature of from room temperature to a temperature less than 700° C. and depositing barium fluoride at a rate of from 1 to 100 Å per minute until the desired thickness of uniform, single crystal, epitaxial barium fluoride has been achieved.

2. The process of claim 1 wherein the temperature in step A is from 550° C. to 650° C.

3. The process of claim 2 wherein the temperature in step A is from 575° C. to 625° C.

4. The process of claim 1 wherein the vacuum in steps A, B, and C has a background pressure of $10^{-9}$ millibars or less.

5. The process of claim 4 wherein the vacuum in steps A, B, and C has a background pressure of $10^{-10}$ millibars or less.

6. The process of claim 1 wherein barium deposition rate in step A is from 1 to 5 Å per minute.

7. The process of claim 6 wherein the barium deposition rate in step A is from 2 to 3 Å per minute.

8. The process of claim 1 wherein the temperature used in step C is from room temperature to 400° C.

9. The process of claim 8 wherein the temperature used in step C is from room temperature to 300° C.

10. The process of claim 9 wherein the temperature used in step C is room temperature.

11. The process of claim 1 wherein the barium fluoride deposition rate in step C is from 1 to 50 Å per minute.

12. The process of claim 11 wherein the barium fluoride deposition rate in step C is from 1 to 5 Å per minute.

13. The process of claim 1 wherein the single crystal gallium arsenide substrate is selected from the group consisting of gallium arsenide single crystal wafers, gallium arsenide epitaxial layers on gallium arsenide single crystal wafers, epitaxial layers of gallium arsenide alloys on single crystal gallium arsenide wafers, heterostructures of super-lattice made of combinations of gallium arsenide alloys on gallium arsenide single wafers, gallium arsenide single crystal epitaxial layers on suitable substrate materials, epitaxial layers of gallium arsenide alloys on suitable substrate materials, and heterostructures of super-lattice made of combinations of gallium arsenide alloys on suitable substrate materials.

14. The process of claim 13 wherein the single crystal gallium arsenide substrate is selected from the group consisting of gallium arsenide single crystal wafers, gallium arsenide epitaxial layers on gallium arsenide single crystal wafers, and gallium arsenide single crystal epitaxial layers on suitable substrate materials.

15. The process of claim 14 wherein the single crystal gallium arsenide substrate is selected from the group consisting of gallium arsenide single crystal wafers.

16. A process for forming a uniform, single, crystal, epitaxial layer of barium fluoride on a single crystal gallium arsenide substrate comprising
   A. vapor depositing a barium compound that is barium chloride, barium iodide, barium bromide, barium fluochloride, barium fluobromide, barium fluoiodide, barium chlorobromide, barium fluorogallate, barium hydride, or barium peroxide on a clean, hot single crystal gallium arsenide substrate at a temperature of from 500° C. to 700° C., in a vacuum having a background pressure of $10^{-8}$ millibars or less and wherein the barium compound deposition is slow enough to allow the barium compound vapor to react with the gallium arsenide substrate surface and form a uniform, epitaxial coating of barium compound/gallium arsenide reaction product and continuing until the reaction product layer is completed;
   B. heating the barium compound/gallium arsenide reaction product layer at a temperature of from 500° C. to 700° C. in the absence of the barium compound vapor in a vacuum having a background pressure of $10^{-8}$ millibars or less to remove unreacted barium compound; and then
   C. heating the substrate at temperature of from room temperature to 700° C. and depositing barium fluoride at a rate of from 1 to 100 Å per minute until the desired thickness of uniform, single crystal, epitaxial barium fluoride has been achieved.

17. The process of claim 16 wherein the barium compound used in step A is barium chloride, barium iodide, barium bromide, barium fluochloride, or barium fluobromide.

18. The process of claim 17 wherein the barium compound used in step A is barium chloride, barium iodide, or barium bromide.

19. The process of claim 16 wherein the temperature in step A is from 550° C. to 650° C.

20. The process of claim 19 wherein the temperature in step A is from 575° C. to 625° C.

21. The process of claim 16 wherein the vacuum in steps A, B, and C has a background pressure of $10^{-9}$ millibars less.

22. The process of claim 21 wherein the vacuum in steps A, B, and C has a background pressure of $10^{-10}$ millibars less.

23. The process of claim 16 wherein barium compound deposition rate in step A is from 1 to 5 Å per minute.

24. The process of claim 23 wherein the barium compound deposition rate in step A is from 2 to 3 Å per minute.

25. The process of claim 16 wherein the temperature used in step C is from room temperature to 400° C.

26. The process of claim 25 wherein the temperature used in step C is from room temperature to 300° C.

27. The process of claim 26 wherein the temperature used in step C is room temperature.

28. The process of claim 16 wherein the barium fluoride deposition rate in step C is from 1 to 50 Å per minute.

29. The process of claim 28 wherein the barium fluoride deposition rate in step C is from 1 to 5 Å per minute.

30. The process of claim 16 wherein the single crystal gallium arsenide substrate is selected from the group consisting of gallium arsenide single crystal wafers, gallium arsenide epitaxial layers on gallium arsenide single crystal wafers, epitaxial layers of gallium arsenide alloys on single crystal gallium arsenide wafers, heterostructures of super-lattice made of combinations of gallium arsenide alloys on gallium arsenide single wafers, gallium arsenide single crystal epitaxial layers on suitable substrate materials, epitaxial layers of gallium arsenide alloys on suitable substrate materials, and heterostructures of super-lattice made of combinations of gallium arsenide alloys on suitable substrate materials.

31. The process of claim 30 wherein the single crystal gallium arsenide substrate is selected from the group consisting of gallium arsenide single crystal wafers, gallium arsenide epitaxial layers on gallium arsenide single crystal wafers, and gallium arsenide single crystal epitaxial layers on suitable substrate materials.

32. The process of claim 31 wherein the single crystal gallium arsenide substrate is selected from the group consisting of gallium arsenide single crystal wafers.

* * * * *